United States Patent
Peterson et al.

(10) Patent No.: US 9,316,492 B2
(45) Date of Patent: Apr. 19, 2016

(54) REDUCING THE IMPACT OF CHARGED PARTICLE BEAMS IN CRITICAL DIMENSION ANALYSIS

(71) Applicant: International Business Machines Corporation, Armonk, NY (US)

(72) Inventors: Kirk D. Peterson, Jericho, VT (US); Dongbing Shao, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 106 days.

(21) Appl. No.: 14/454,748

(22) Filed: Aug. 8, 2014

(65) Prior Publication Data
US 2016/0040986 A1     Feb. 11, 2016

(51) Int. Cl.
*H01J 37/00*  (2006.01)
*G01B 15/04*  (2006.01)
*H01J 37/28*  (2006.01)

(52) U.S. Cl.
CPC .............. *G01B 15/04* (2013.01); *H01J 37/28* (2013.01)

(58) Field of Classification Search
CPC ................................ G01B 15/04; H01J 37/28
USPC .................... 250/306, 307, 310, 311
See application file for complete search history.

(56) References Cited

U.S. PATENT DOCUMENTS

| | | | | |
|---|---|---|---|---|
| 5,276,325 A | * | 1/1994 | Todokoro | G02B 21/002 250/306 |
| 7,045,782 B2 | * | 5/2006 | Ikeda | G01N 23/2251 250/306 |
| 2009/0133716 A1 | | 5/2009 | Lee | |
| 2010/0038535 A1 | * | 2/2010 | Nasu | G01B 15/00 250/307 |
| 2012/0298865 A1 | | 11/2012 | Omori et al. | |

FOREIGN PATENT DOCUMENTS

| | | |
|---|---|---|
| JP | 2004163420 A | 6/2004 |
| JP | 2010044091 A | 2/2010 |
| JP | 4472305 B2 | 6/2010 |
| JP | 5037590 B2 | 9/2012 |
| WO | 9817060 A1 | 4/1998 |

OTHER PUBLICATIONS

Lee et al, "Measurement of critical dimension in scanning electron microscope mask images," J. Micro/Nanolith., MEMS MOEMS, 10(2), 023003 (Apr.-Jun. 2011).

\* cited by examiner

*Primary Examiner* — Michael Maskell
(74) *Attorney, Agent, or Firm* — Steven J. Meyers; David Zwick; Howard M. Cohn

(57) ABSTRACT

Measuring a feature on a wafer, the feature including at least two edges. Scanning the wafer with an electron beam over the length of a first scan interval that includes at least a portion of a first edge of the feature. Preventing the electron beam from illuminating the wafer while moving the scan position of the electron beam across a portion of the wafer to a second scan interval that includes at least a portion of a second edge of the feature. Scanning the wafer with an electron beam over the length of the second scan interval. Determining a distance between the first and second edges of the feature.

12 Claims, 4 Drawing Sheets

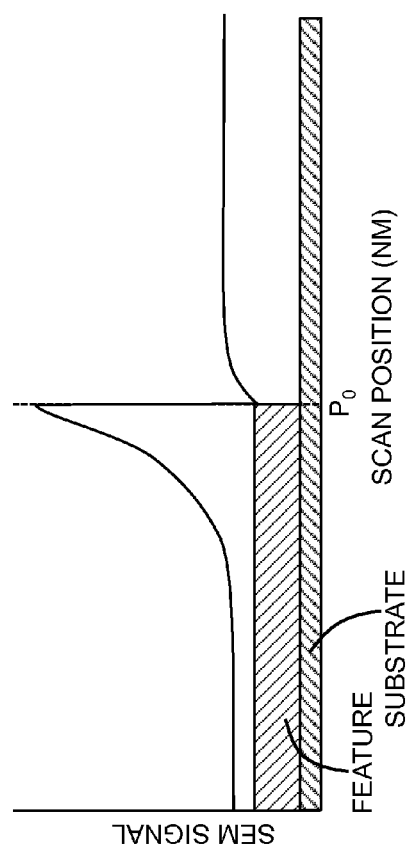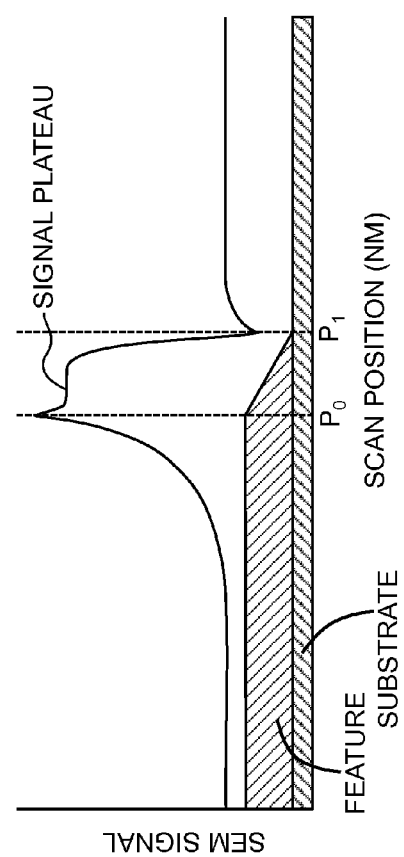

REDUCING THE IMPACT OF CHARGED PARTICLE BEAMS IN CRITICAL DIMENSION ANALYSIS

BACKGROUND

The present invention relates generally to the field of inspection of a solid object by a charged particle beam, and more particularly to techniques to reduce the effect of the charged particle beam on the object being inspected.

Microelectronic fabrication requires accurate measurement of features in a microelectronic structure to ensure proper process control. A typical measurement technique uses a scanning electron microscope (SEM) to measure structural features, typically surface features that may be accessed by the electron beam of the SEM. In an SEM, accelerated electrons are tightly focused into a beam that is used as a measurement probe for the microelectronic structures, and the beam is scanned across the feature to be measured. When the electron beam is incident on a structure, the electrons interact with atoms in the structure to produce various signals that can be detected and that contain information about the structure's surface topography and composition. A blanking signal to the SEM is used to interrupt the electron beam incident on the structure. This may be accomplished, for example, by interrupting power to the electron emitter, deflecting the electron beam, blocking the electron beam, or any other suitable method.

A common method of SEM measurement is based on the detection of secondary electrons emitted by atoms excited by the electron beam. Secondary electrons that exit the structure in any direction may be captured, accelerated, and detected by a scintillator and photomultiplier arrangement. While secondary electrons are emitted in all directions, they are more concentrated in the direction of the beam. Thus, for example, an electron beam that is incident perpendicular to a flat surface will result in fewer detectable secondary electrons than an electron beam that is incident on a tilted surface. Similarly, an electron beam that is incident on a concave surface, for example, where a feature formed on top of a surface meets the surface, will result in fewer detectable secondary electrons. This property of secondary electron emission makes SEMs useful in detecting feature "edges", as outside edges tend to produce larger secondary electron currents relative to neighboring flat portions, and inside edges tend to produce smaller relative secondary electron currents. An edge generally may be any topographical feature of the microelectronic structure that is topographically distinguishable from its surrounding topography. As the electron beam is scanned across the feature, changes in the topography of the feature along the scan path may be detected. Correlating the beam position to positions on the microelectronic feature may allow for high precision measurements of various feature characteristics.

SUMMARY

Embodiments of the present invention disclose method for measuring a feature on a wafer, the feature including at least two edges. Scanning the wafer with an electron beam over the length of a first scan interval that includes at least a portion of a first edge of the feature. Preventing the electron beam from illuminating the wafer while moving the scan position of the electron beam across a portion of the wafer to a second scan interval that includes at least a portion of a second edge of the feature. Scanning the wafer with an electron beam over the length of the second scan interval. Determining a distance between the first and second edges of the feature.

In a second aspect of the invention, the electron beam is aligned to the start of a first scan interval that includes a first edge of the feature. Illuminating the wafer with the electron beam when the scan position of the electron beam is at the start of the first scan interval. Scanning the wafer over the length of the first scan interval. Preventing the electron beam from illuminating the wafer when the scan position of the electron beam reaches the end of the first scan interval. Aligning the electron beam to the start of a second scan interval that includes a second edge of the feature. Illuminating the wafer with the electron beam when the scan position of the electron beam is at the start of the second scan interval. Scanning the wafer over the length of the second scan interval. Preventing the electron beam from illuminating the wafer when the scan position of the electron beam reaches the end of the second scan interval.

In a third aspect of the invention, the wafer is scanned with an electron beam in a first scan interval that includes at least a portion of a first edge of the feature. Preventing the electron beam from illuminating the wafer while moving the scan position of the electron beam across a portion of the wafer to a second scan interval that includes at least a portion of a second edge of the feature. Scanning the wafer with an electron beam in the second scan interval. Determining a distance between the first and second edges of the feature, based on a signal representative of emissions from the feature and/or wafer caused by the interaction of the electron beam and the feature and/or wafer.

BRIEF DESCRIPTION OF THE SEVERAL VIEWS OF THE DRAWINGS

FIG. 1 depicts a composite graph showing a microelectronic fabrication feature with a sharp edge, and model signals that may be detected by an SEM resulting from a scanning electron beam incident on the edge, in accordance with embodiments of the invention.

FIG. 2 depicts composite graph showing a microelectronic fabrication feature have a sloped edge, and model signals that may be detected by an SEM resulting from a scanning electron beam incident on the edges of the feature, in accordance with embodiments of the invention.

DETAILED DESCRIPTION

Figure 3:
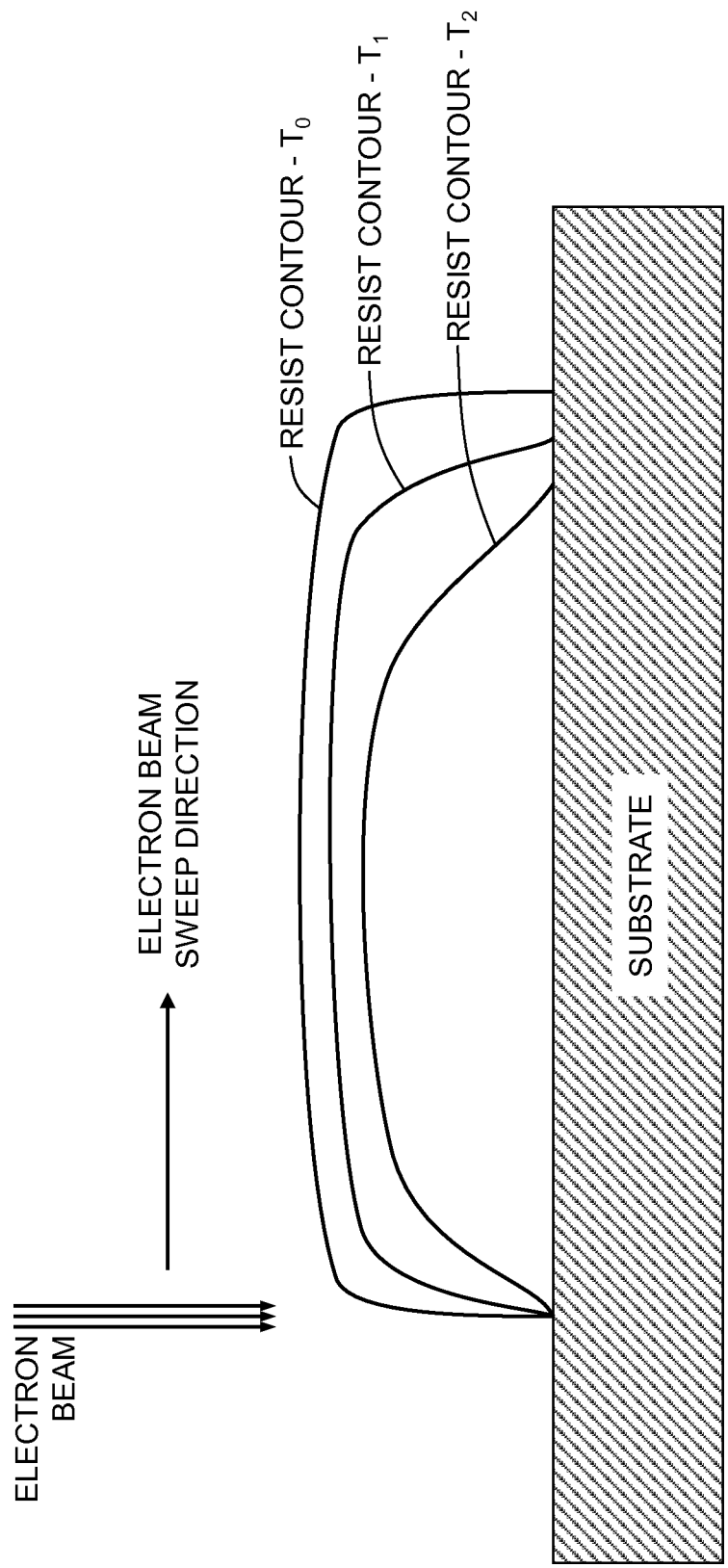
FIG. 3 depicts representative effects of a scanning electron beam on a resist feature atop a substrate, in accordance with embodiments of the invention.

The present invention will now be described in detail with reference to the figures. FIGS. 1 and 2 depict composite graphs showing microelectronic fabrication features, and model signals that may be detected by an SEM resulting from a scanning electron beam incident on the edges of the features, in accordance with embodiments of the invention. In the figures, the scale of the features is in the nanometer range, and the SEM signal has arbitrary units.

In FIG. 1, a microelectronic fabrication feature with a vertical edge at position $P_0$ is shown atop of a substrate. A model secondary electron emission signal resulting from an electron beam incident perpendicular to the substrate surface, that may be detected by an SEM, is illustrated on the figure in alignment with the feature. As can be seen, when the beam is incident on the flat top surface of the feature and on the substrate away from position $P_0$, detectable secondary electron emissions are at a steady rate. When the beam is incident on the feature near position $P_0$, secondary electron emissions may exit the feature, and be detected, from the top surface and also from the exposed edge of the feature at $P_0$. The additional secondary electron emissions exiting the feature from the edge at $P_0$ result in an increasing detected signal that peaks as the beam incident on the feature approaches the feature edge at position $P_0$. As the beam passes off the feature onto the substrate at position $P_0$, a trough in detectable secondary electron emissions occurs as the secondary electrons emitted from the substrate in the direction of the feature remain within the feature. As the beam incident on the substrate moves farther away from position $P_0$, the detectable secondary electron emissions returns to the steady rate.

In FIG. 2, a microelectronic fabrication feature with a sloped edge beginning at position $P_0$ and meeting the substrate at position $P_1$ is shown atop of a substrate, with a model secondary electron emission signal resulting from an electron beam incident perpendicular to the substrate surface, that may be detected by an SEM, illustrated on the figure in alignment with the feature. Similar to the SEM signal illustrated in FIG. 1, the SEM signal resulting from scanning the feature in FIG. 2 shows a peak at position $P_0$, and a trough at position $P_1$. As the beam moves along the feature's sloped edge between positions $P_0$ and $P_1$, detectable secondary electron emissions occur at a second steady rate, and result in a plateau in the SEM signal. As can be seen from FIGS. 1 and 2, as the edges become less sharp, the characteristic peak and trough become less discernable from the surrounding data, and may appear in the analyzed signal data as local maximums and minimums.

FIGS. 1 and 2 depict a rather idealized SEM signal trace. In practice, the signal may contain a significant noise component, which may cause difficulty in determining edge locations of microelectronic fabrication features to a desired degree of accuracy. In "Measurement of Critical Dimension in Scanning Electron Microscope Mask Images," Lee et al, J. Micro/Nanolith, MEMS MOEMS 10(2), 023003 (April-June 2011) ("Lee"), a major component of noise is identified to be back-scattered electrons from the incident SEM electron beam. This noise does not have a Gaussian distribution, but instead coherently interferes with the secondary electron emissions to cause speckle noise. The speckles are spread over the entire SEM image, and may interfere with the accurate detection and analysis of the secondary electron emissions intensity signal. Lee discloses a technique that may identify secondary electron emissions intensity peaks in the SEM signal that filters out the speckle noise in the signal data through the use of a nonlinear anisotropic filter, then applies a multiple Gaussian curve fitting technique to identify the peaks and troughs that correlate to microelectronic fabrication feature edges.

The analysis of the SEM signal and determination of the most likely location of feature edges may occur as part of the SEM scanning operation, for example, to display a representation of the feature on a display screen as the scan is occurring, or may occur as a post-processing signal processing operation after the SEM signal data has been collected.

As highly accurate as measurements using SEM may be, the technique is not without problems. Electron charging of the feature being measured may increase the noise in the detected secondary electron emission, making it more difficult to make an accurate measurement. Electron charging may also cause damage to the wafer and the features in the scan path of the electron beam.

Another problem with SEM is shrinkage resulting from the beam incident on certain materials. For example, photoresist materials that react to an argon fluoride laser beam ("ArF resists"), which usually comprise acrylic resins, may condense when exposed to an electron beam, resulting in a reduction in volume ("shrinkage") and a deforming of the circuit pattern. This shrinkage may be significant, and may result in inaccurate SEM measurement results.

FIG. 3 depicts representative effects of a scanning electron beam on a resist feature atop a substrate, in accordance with embodiments of the invention. As shown, an electron beam scans a resist feature atop a substrate from left to right, completing the scan in a time interval between a time $T_0$ and $T_2$. As the scan of the resist feature begins at time $T_0$, the contour of the resist feature is indicated as not deformed. As the scan of the resist feature progresses from left to right, at an intermediate time $T_1$, the contour of the resist feature has deformed. For example, as indicated, the resist feature has shrunk in volume, and the right edge of the feature has been pulled leftward. At time T2, the scan has completed, and, for example, the resist feature has experienced additional shrinkage and deformation, and the right edge of the feature has been pulled farther leftward. FIG. 3 is representative of the deformation and shrinkage effects of an electron beam incident on a resist feature. The actual deformation and shrinkage that may occur as a result of electron beam incident on a resist feature may vary from what is depicted in the figure.

One technique to address the problem of resist shrinkage is disclosed in U.S. Pat. No. 7,045,782 to Ikeda et al. ("Ikeda"). Ikeda discloses a scanning method for an SEM that minimizes a degradation in dimension measuring accuracy caused by a shrink of a specimen. A time between the first and the second scan over the same location on the specimen is shortened by changing the scanning order of scan lines to enable the scanning to be performed successively while the shrink is small.

Ikeda discloses that the shrink of an ArF resist pattern is considered to be a chemical reaction caused by the energy of a focused electron beam incident on the resist. The volume of the ArF resist will change after the irradiation of electron beam according to equation (1):

$$V_s = V e^{-t/\tau} \qquad (1)$$

where $V_S$ is a volume of the ArF resist after being irradiated with an electron beam, V is a volume of the ArF resist before the application of the electron beam, $\tau$ is a time constant of the chemical reaction in the ArF resist, and t is an elapsed time.

As can be seen from equation (1), there is a time lag from when an electron beam is radiated against the ArF resist until the resist shrinks by a chemical reaction. The technique of Ikeda takes advantage of this time lag to adjust the scanning order of scan lines to perform all scans over the same location of a specimen within a time interval sufficient to complete all the scans while the amount of shrinkage is small.

Another technique to address the problem of resist shrinkage is disclosed in U.S. Pat. Pub. No. 2012/0298865 to Omori et al. ("Omori"). Omori discloses a technique in which the amount of change of a pattern shape caused by electron beam irradiation is calculated and stored. The pattern shape contour before the sample is irradiated with an electron beam is restored from a pattern shape contour in a scanning electron microscope image after the sample is irradiated with an electron beam using the calculated amount. Thus, the shrinking of a resist and/or the effect of electrostatic charge caused when a sample is irradiated with an electron beam are eliminated, so that the shape contour of a two-dimensional pattern before irradiating an electron beam can be restored with a high degree of accuracy, and the dimension of a pattern can be measured with a high degree of accuracy, using the restored image.

Both these techniques are directed to adjusting for the physical effects of the scanning electron beam on the structure being measured, such as shrinkage, as these effects relate to dimensional measurements. In contrast, embodiments of the present invention are directed generally to reducing the amount of incident electrons on a structure to be measured.

Figure 4:
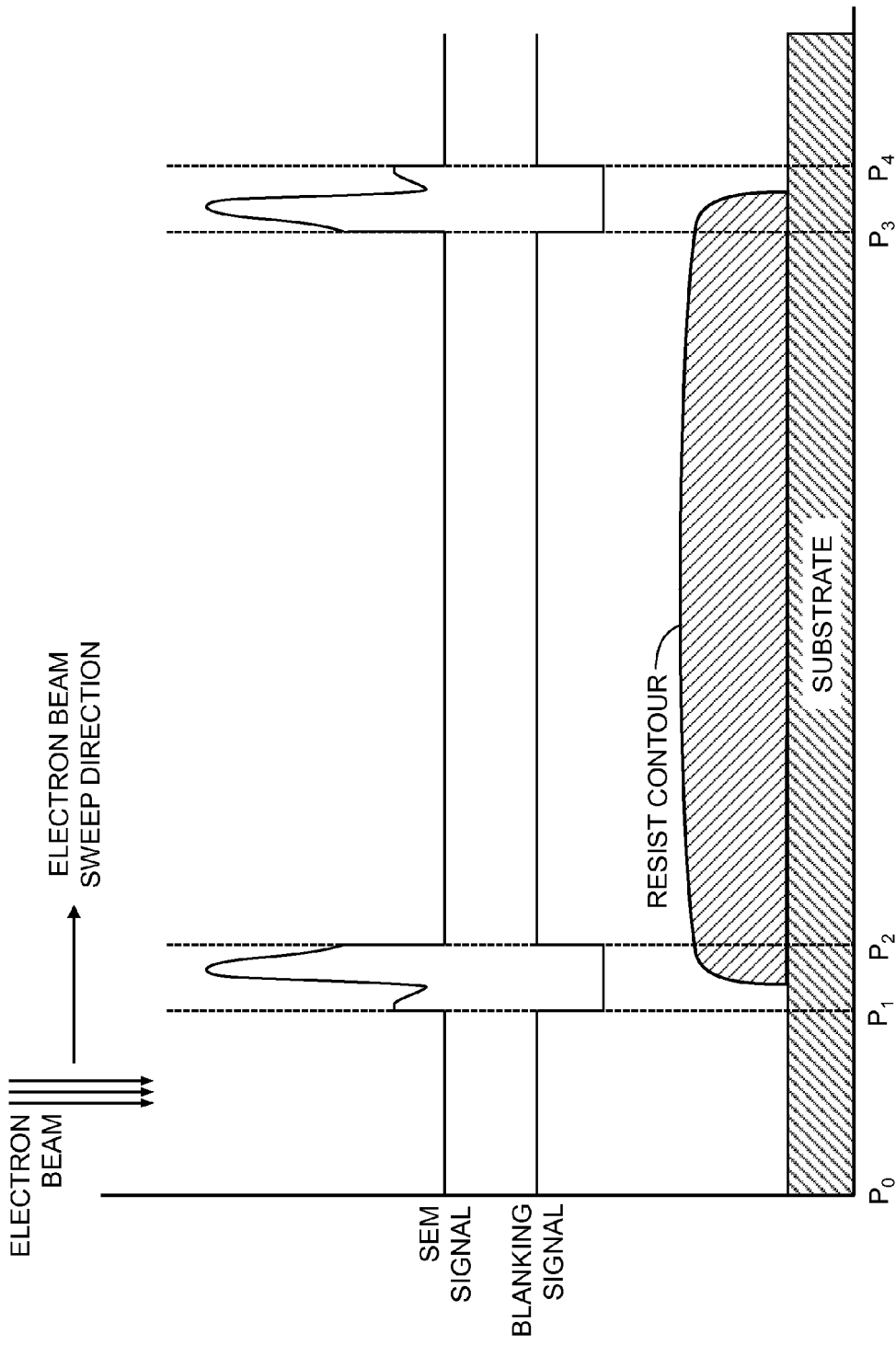
FIG. 4 depicts a composite graph illustrating a method to reduce the amount of incident electrons on a structure to be measured, in accordance with embodiments of the invention.

FIG. 4 is a composite graph illustrating a method to reduce the amount of incident electrons on a structure to be measured, in accordance with embodiments of the invention. As illustrated, a resist feature is shown atop a substrate. The electron beam of an SEM is first aligned to the resist feature. This may be accomplished, for example, by alignment of the SEM to alignment structures on the wafer upon which the resist feature is formed, and indexing over to the structure. In another embodiment, the alignment process may be based on design and coordinate information associated with the wafer.

In this illustration, the electron beam of the scanning electron microscope scans the feature from left to right. A blanking signal to the SEM controls the electron beam such that the beam is incident on the feature only at the feature edges. For example, as the beam alignment moves from position $P_0$ to position $P_1$, the blanking signal is asserted, and the beam is not allowed to illuminate the resist structure or substrate. Because the beam is not causing any secondary electron emissions from the substrate or the resist feature, the SEM detection signal is at a zero state. At position $P_1$, as the beam alignment approaches the leading edge of the resist structure, the blanking signal is deasserted, and the beam illuminates the substrate. As shown, the SEM signal begins detecting secondary electron emissions from the substrate surface. As the beam becomes incident on the leading edge of the resist feature, the SEM signal displays the characteristic trough in signal strength associated with an inside edge. As the beam passes the top edge of the resist feature, the SEM signal displays the characteristic peak associated with an outside edge. As the beam moves past the edge to position $P_2$, the blanking signal is asserted, and the beam is not allowed to illuminate the resist structure.

As the beam alignment moves from position $P_2$ to position $P_3$, the resist structure is not illuminated by the electron beam. In accordance with embodiments of the invention, this serves to reduce shrinkage, deformation, charging, and other effects and damage to the resist feature caused by an incident electron beam, and to increase the accuracy of measurements that would otherwise be skewed by shrinkage and deformation of the resist feature.

As the beam alignment reaches position $P_3$, the blanking signal is deasserted, and the beam is allowed to illuminate the structure. As the beam moves from position $P_3$ to position $P_4$, the SEM detection signal displays the characteristic peak and trough associated with the trailing edge of the structure. As the beam alignment reaches position $P_4$, the blanking signal is asserted, and the electron beam is not allowed to illuminate the substrate.

The scanning intervals between positions $P_1$ and $P_2$, and positions $P_3$ and $P_4$ may generally be determined as sufficient to provide enough data that edges on the structure being measured may be detected in the analyzed SEM signal data. In other words, the characteristic signal peak and signal trough associated with inner and outer structure edges should be able to be detected with a sufficient likelihood of accuracy, for example, a likelihood of accuracy above a 95% threshold value, in the analyzed signal data. This may be based, for example, on the signal to noise ratio in the SEM detection signal, the feature edge geometry, the effectiveness of the signal analysis used to detect the peaks and troughs in the signal data associated with feature edges, the cross-sectional dimensions of the scanning electron beam, etc. Heuristic and experimental approaches may be used to determine a sufficient scanning interval. For example, a sufficient interval may be one in which the analyzed data indicates an intensity peak (or trough) with a 5-20% departure from the minimum (or maximum) intensity values of the remaining data in the interval. Another embodiment may define the interval based on a percentage, for example, 5-20%, of the signal development range. For example, if the scan position of a beam approaching a feature edge indicates a discernible rise in intensity to a peak value over a scan distance of 5 nm, the scanning interval may be set to between 0.5 nm to 2 nm for this feature edge.

Figure 5:
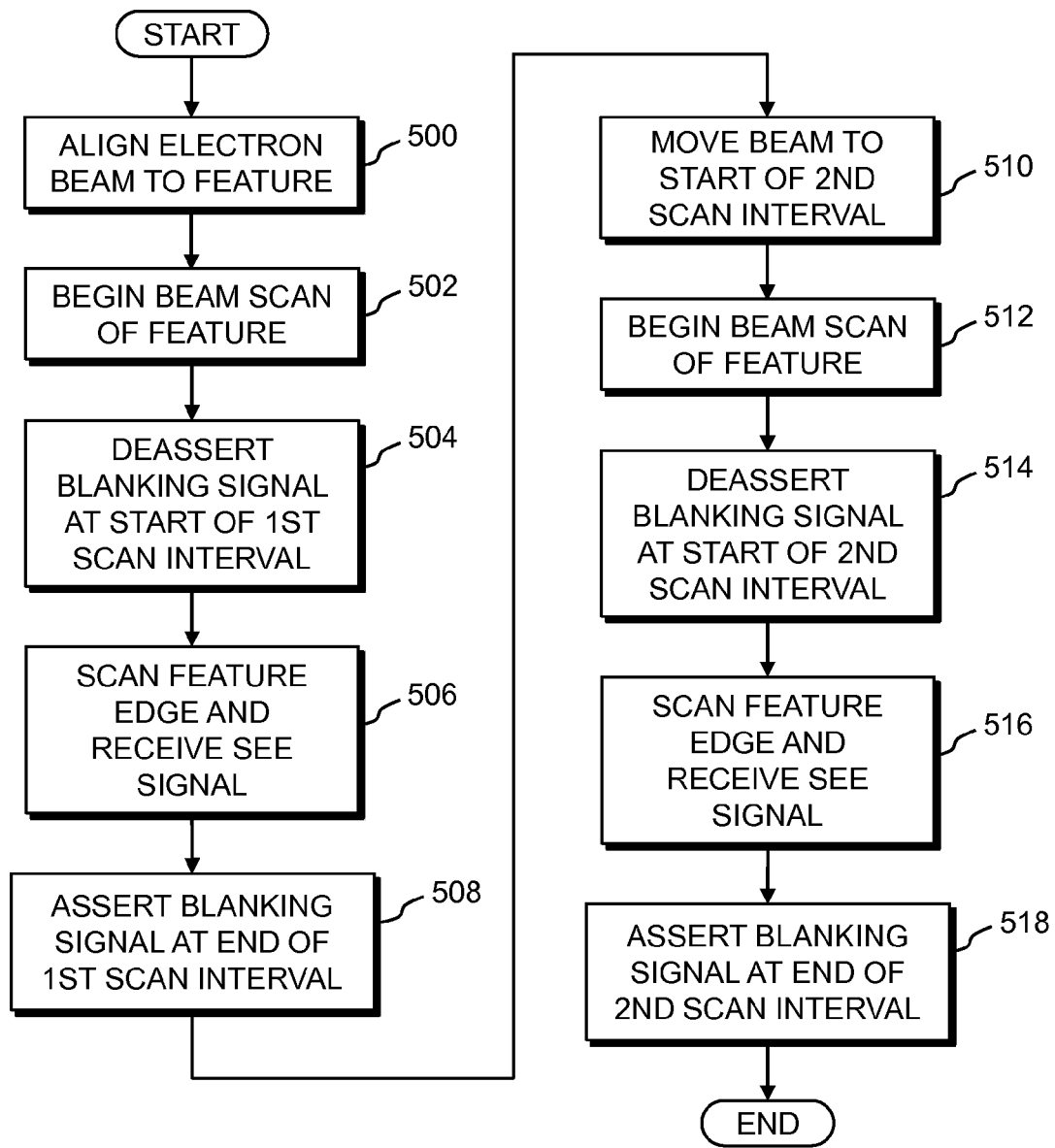
FIG. 5 is a flowchart illustrating the steps an SEM may perform, in accordance with an embodiment of the invention.

FIG. 5 is a flowchart illustrating the steps an SEM may perform, in accordance with an embodiment of the invention. After the wafer having the feature to be measured is loaded into the SEM, the electron beam is aligned with the feature (step 500). As described above, this may be accomplished, for example, by alignment of the SEM to alignment structures on the wafer upon which the resist feature is formed, and indexing over to the structure. In another embodiment, the alignment process may be based on design and coordinate information associated with the wafer. After alignment of the beam with the feature, scanning of the first edge of the feature may begin (step 502). When the beam alignment reaches the start of the first scan interval, the blanking signal is deasserted, allowing the electron beam to illuminate the wafer (step 504). The electron beam scans the first feature edge, and the SEM detects the secondary electron emissions signal (step 506). When the beam alignment reaches the end of the first scan interval, the blanking signal is asserted, and the beam is not allowed to illuminate the resist structure or substrate (step 508).

The electron beam is then aligned with the start of the second scan interval associated with the second edge of the feature to be scanned (step 510). In particular, as the beam alignment moves across the feature to be measured to the second scan interval, the blanking signal remains asserted, and the feature is not illuminated by the electron beam, thus reducing any physical effects, such as shrinkage and charging, that may result from the electron beam incident on the structure.

After alignment of the beam to the second scan interval, scanning of the second edge of the feature may begin (step 512). The blanking signal is deasserted (step 514), the second edge of the feature of the feature is scanned, and the SEM detects the secondary electron emissions signal (step 516). When the beam alignment reaches the end of the second scanning interval, the blanking signal is asserted (step 518), and the beam is not allowed to illuminate the resist structure or substrate.

As described above, the analysis of the SEM signal and determination of the most likely location of feature edges may occur as part of the SEM scanning operation, for example, to display a representation of the feature on a display screen as the scan is occurring, or may occur as a post-processing signal processing operation after the SEM signal data has been collected.

Based on the foregoing, a computer system, method, and computer program product have been disclosed. However, numerous modifications and substitutions can be made without deviating from the scope of the present invention. Therefore, the present invention has been disclosed by way of example and not limitation.

What is claimed is:

1. A method for measuring a feature on a wafer using, the feature including at least two edges, the method comprising:
scanning the wafer with an electron beam over the length of a first scan interval that includes at least a portion of a first edge of the feature;
preventing the electron beam from illuminating the wafer while moving the scan position of the electron beam across a portion of the wafer to a second scan interval that includes at least a portion of a second edge of the feature;
scanning the wafer with the electron beam over the length of the second scan interval; and
determining a distance between the first and second edges of the feature.

2. A method in accordance with claim 1, wherein determining a distance further comprises:
receiving a signal representative of emissions from the feature and/or wafer caused by the interaction of the electron beam and the feature and/or wafer;
analyzing the signal to determine most likely locations for the first and second edges of the feature; and
determining a distance between the most likely locations for the first and second edges of the feature.

3. A method in accordance with claim 1, wherein scanning the wafer over the length of the first and/or second scan interval further comprises:
aligning the electron beam to the start of the scan interval, wherein aligning includes one or more of: aligning the electron beam to alignment structures on the wafer and indexing over to the start of the scan interval; aligning the electron beam based on design and coordinate information associated with the wafer.

4. A method in accordance with claim 2, wherein the first and/or second scan intervals are determined based on one or more of: a likelihood of accuracy, above a threshold value, in detecting in the analyzed signal a characteristic signal peak or signal trough associated with an inner or outer feature edge; the cross-sectional dimensions of the scanning electron beam; the feature edge geometry; the analyzed data indicates an intensity peak (or trough) with a departure above a threshold value from the minimum (or maximum) intensity values of the remaining signal data in the interval; a percentage of the signal development range.

5. A method for measuring a feature on a wafer, the method comprising:
aligning an electron beam to the start of a first scan interval that includes a first edge of the feature;
illuminating the wafer with the electron beam when the scan position of the electron beam is at the start of the first scan interval;
scanning the wafer over the length of the first scan interval;
preventing the electron beam from illuminating the wafer when the scan position of the electron beam reaches the end of the first scan interval;
aligning the electron beam to the start of a second scan interval that includes a second edge of the feature;
illuminating the wafer with the electron beam when the scan position of the electron beam is at the start of the second scan interval;
scanning the wafer over the length of the second scan interval; and
preventing the electron beam from illuminating the wafer when the scan position of the electron beam reaches the end of the second scan interval.

6. A method in accordance with claim 5, further comprising:
receiving a signal representative of emissions from the feature and/or wafer caused by the interaction of the electron beam and the feature and wafer;
analyzing the signal to determine most likely locations for the first and second edges of the feature; and
determining a distance between the most likely locations for the first and second edges of the feature.

7. A method in accordance with claim 5, wherein aligning the electron beam to the start of the first scan interval and/or aligning the electron beam to the start of the second scan interval comprises one or more of: aligning the electron beam to alignment structures on the wafer and indexing over to the start of the first and/or second scan interval; aligning the electron beam based on design and coordinate information associated with the wafer.

8. A method in accordance with claim 6, wherein the first and/or second scan intervals are determined based on one or more of: a likelihood of accuracy, above a threshold value, in detecting in the analyzed signal a characteristic signal peak or signal trough associated with an inner or outer feature edge; the cross-sectional dimensions of the scanning electron beam; the feature edge geometry; the analyzed data indicates an intensity peak (or trough) with a departure above a threshold value from the minimum (or maximum) intensity values of the remaining signal data in the interval; a percentage of the signal development range.

9. A method for measuring a feature on a wafer, the feature including at least two edges, the method comprising:
scanning the wafer with an electron beam in a first scan interval that includes at least a portion of a first edge of the feature;
preventing the electron beam from illuminating the wafer while moving the scan position of the electron beam across a portion of the wafer to a second scan interval that includes at least a portion of a second edge of the feature;
scanning the wafer with the electron beam in the second scan interval; and
determining a distance between the first and second edges of the feature, based on a signal representative of emissions from the feature and/or wafer caused by the interaction of the electron beam and the feature and/or wafer.

10. A method in accordance with claim 9, wherein determining a distance further comprises:
receiving the signal representative of emissions from the feature and/or wafer caused by the interaction of the electron beam and the feature and/or wafer;
analyzing the signal to determine most likely locations for the first and second edges of the feature; and
determining a distance between the most likely locations for the first and second edges of the feature.

11. A method in accordance with claim 9, wherein scanning the wafer over the length of the first and/or second scan interval further comprises:
aligning the electron beam to the start of the scan interval, wherein aligning includes one or more of: aligning the electron beam to alignment structures on the wafer and indexing over to the start of the scan interval; aligning the electron beam based on design and coordinate information associated with the wafer.

12. A method in accordance with claim 10, wherein the first and/or second scan intervals are determined based on one or more of: a likelihood of accuracy, above a threshold value, in detecting in the analyzed signal a characteristic signal peak or signal trough associated with an inner or outer feature edge;

the cross-sectional dimensions of the scanning electron beam; the feature edge geometry; the analyzed data indicates an intensity peak (or trough) with a departure above a threshold value from the minimum (or maximum) intensity values of the remaining signal data in the interval; a percentage of the signal development range.

* * * * *